United States Patent
Lee et al.

(10) Patent No.: US 11,939,439 B2
(45) Date of Patent: Mar. 26, 2024

(54) COMPOSITE POLYIMIDE FILM, PRODUCING METHOD THEREOF, AND PRINTED CIRCUIT BOARD USING SAME

(71) Applicant: LG ELECTRONICS INC., Seoul (KR)

(72) Inventors: Junseok Lee, Seoul (KR); Dongjoo You, Seoul (KR); Seongmoon Cho, Seoul (KR); Jinkyun Lee, Seoul (KR); Seungsoo Choi, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 103 days.

(21) Appl. No.: 17/536,604

(22) Filed: Nov. 29, 2021

(65) Prior Publication Data
US 2022/0169807 A1    Jun. 2, 2022

(30) Foreign Application Priority Data

Nov. 27, 2020 (KR) .......... 10-2020-0162598
Oct. 26, 2021 (KR) .......... 10-2021-0143951

(51) Int. Cl.
C08J 5/18 (2006.01)
C08K 3/36 (2006.01)
C08K 7/26 (2006.01)

(52) U.S. Cl.
CPC ................ C08J 5/18 (2013.01);
C08K 3/36 (2013.01); C08K 7/26 (2013.01);
C08J 2327/18 (2013.01); C08J 2379/08 (2013.01); C08K 2201/002 (2013.01)

(58) Field of Classification Search
CPC ...... C08J 5/18; C08J 2327/18; C08J 2379/18; C08K 3/36; C08K 7/26; C08K 2201/002; C08K 9/08; C08L 79/08; H05K 2201/015; H05K 2201/0154; H05K 2201/0209
See application file for complete search history.

(56) References Cited

U.S. PATENT DOCUMENTS

2016/0096952 A1* 4/2016 Park .......................... C08J 5/18
                                                                524/263

FOREIGN PATENT DOCUMENTS

| CN | 109627470 A | * 4/2019 | ............ C08G 73/10 |
| JP | 2007-084347 |   4/2007 | |
| KR | 10-2014-0136235 | 11/2014 | |

OTHER PUBLICATIONS

Sawada, Yasushi, Plasma-polymerized tetrafluoroethylene coatings on silica particles by atmospheric-pressure glow discharge, Powder Technology 90 (1997) 245-250.*

* cited by examiner

*Primary Examiner* — Arrie L Reuther
*Assistant Examiner* — Olga Lucia Donahue
(74) *Attorney, Agent, or Firm* — LEE, HONG, DEGERMAN, KANG & WAIMEY

(57) ABSTRACT

The present invention is applicable to a field of a substrate for a high-frequency circuit, and relates, for example, to a composite polyimide film, a producing method thereof, and a printed circuit board using the same. More specifically, the composite polyimide film includes a film matrix including polyimide; and a plurality of filler particles dispersed in the film matrix, wherein each of the filler particles includes an inorganic particle, and a fluorine polymer coating formed on the inorganic particle.

17 Claims, 15 Drawing Sheets

(A)                 (B)                 (C)

(A)

(B)

(C)

(D)

(E)

(A)　　　　　　　　　　(B)　　　　　　　　　　(C)

COMPOSITE POLYIMIDE FILM, PRODUCING METHOD THEREOF, AND PRINTED CIRCUIT BOARD USING SAME

CROSS-REFERENCE TO RELATED APPLICATIONS

Pursuant to 35 U.S.C. § 119(a), this application claims the benefit of earlier filing date and right of priority to Korean Patent Application Nos. 10-2020-0162598, filed on Nov. 27, 2020 and 10-2021-0143951, filed on Oct. 26, 2021, the contents of which are hereby incorporated by reference herein in its entirety.

BACKGROUND OF THE DISCLOSURE

Field of the Disclosure

The present disclosure is applicable to a field of a substrate for a high-frequency circuit, and relates, for example, to a composite polyimide film, a producing method thereof, and a printed circuit board using the same.

Discussion of the Related Art

With development of society, miniaturization of home appliances is progressing. The miniaturization of the home appliances requires a flexible printed circuit board (FPCB).

A rigid printed circuit board (PCB) is used as a main board of the home appliance. In order that the home appliance has various functions, it is necessary to connect many parts thereof to the main board. In this case, the FPCB may contribute to the miniaturization due to high connectivity.

Recently, a user device may connect to the Internet in a wireless manner in an outdoor environment. For this purpose, a radio wave reception function is provided in a notebook computer and a smartphone.

With development of communication technology, a speed of Internet access is getting faster. Now is the time of transition from 4G to 5G. An era of new high-speed communication using a gigahertz (GHz) band is opening in the future. According to the 5G standard, a millimeter wavelength (mm wavelength) is employed, which may correspond to a frequency of approximately 24 to 100 GHz.

Until now, polyimide as a heat-resistant polymer material has been used as a material for FPCB. This is because polyimide has excellent dimensional stability with a copper foil used for circuit formation and has reverse heat resistance during component mounting.

However, polyimide had drawbacks in that a magnitude of polarization due to charge transfer and an absorption are large. Due to this defect, dielectric constant or dielectric loss increases, resulting in a large transmission loss.

These problems are becoming more prominent in the era (since 5G) of using high-speed communication in the GHz band. Further, as materials suitable for the high-speed communication in the GHz band have begun to be developed, demand for removal of these shortcomings of polyimide is increasing.

When the 5G communication starts, a transmission/reception speed is rapidly increased. However, a signal has strong linearity and loss increases. In order to overcome this situation, currently, sub6 and 5G smartphones use LCP as a type of liquid crystal or polyimide (PI) as an interlayer insulator with low signal loss.

A price of LCP is high. The LCP has a high possibility defects due to poor processability and poor adhesion to the copper foil during substrate formation.

Further, the polyimide (PI) may not be applied to 5G smartphones using the mmWave frequency band in the future due to an increase in dielectric loss due to its high hygroscopicity.

Therefore, there is a demand for development of a new polyimide material in which the polarization is smaller and the moisture absorption are lowered while maintaining advantages of polyimide.

SUMMARY OF THE DISCLOSURE

A technical purpose of the present disclosure is to provide a composite polyimide film which is incorporated into an interlayer insulator and thus is capable of reducing signal loss in a high frequency 5G area, a producing method thereof, and a printed circuit board using the same.

Further, A technical purpose of the present disclosure is to provide a composite polyimide film including organic/inorganic composite filler particles that is thermally stable even at high temperatures and has lowered dielectric constant and hygroscopicity, a method for producing the same, and a printed circuit board using the same.

According to some embodiments, a fluorine polymer is chemically coupled to surfaces of inorganic particles (in an example, silica particles) via a polymerization process of a fluorine-based monomer to produce filler particles. Then, these filler particles are mixed with a polyamic acid solution to produce a composite polyimide thin film.

A first aspect of the present disclosure provides a composite polyimide film comprising: a film matrix including polyimide; and a plurality of filler particles dispersed in the film matrix, wherein the filler particle includes an inorganic particle, and a fluorine polymer coating formed on the inorganic particle.

In one implementation of the composite polyimide film, the inorganic particle includes a silica ($SiO_2$) particle.

In one implementation of the composite polyimide film, the silica particle includes a hollow silica particle or a mesoporous silica particle.

In one implementation of the composite polyimide film, air is contained in the silica particle, wherein a volume percentage of air is in a range of 4.8 to 20.6% based on a total volume of the film.

In one implementation of the composite polyimide film, the fluorine polymer is contained in at least a portion of a pore of the silica particle.

In one implementation of the composite polyimide film, the fluorine polymer coating acts to reduce at least one of a dielectric constant and hygroscopicity of the composite polyimide film.

In one implementation of the composite polyimide film, the fluorine polymer includes polytetrafluoroethylene (PTFE).

In one implementation of the composite polyimide film, the filler particles are contained in an amount of 10 to 40 weight percentage (wt. %) based on a total weight of the film.

In one implementation of the composite polyimide film, the filler particles are contained in a volume percentage of 8 to 35% based on a total volume of the film.

In one implementation of the composite polyimide film, the filler particle has a size of 100 to 1000 nm.

In one implementation of the composite polyimide film, the filler particles are dispersed and distributed in the film matrix.

A second aspect of the present disclosure provides a printed circuit board comprising: a composite polyimide film including: a film matrix including polyimide, and a plurality of filler particles dispersed in the film matrix, wherein the filler particle includes an inorganic particle, and a fluorine polymer coating formed on the inorganic particle; and a circuit pattern formed on the composite polyimide film.

A third aspect of the present disclosure provides a method for producing a composite polyimide film, the method comprising: treating surfaces of inorganic particles; dispersing the inorganic particles in a solvent; polymerizing a fluorinated polymer coating onto the inorganic particles to produce filler particles; dispersing the filler particles in a polyamic acid solvent; and converting the polyamic acid solution into a film.

In one implementation of the method, treating the surfaces of the inorganic particles includes treating the surfaces of the inorganic particles with reactive silane.

In one implementation of the method, the treatment of the surfaces of the inorganic particles imparts hydrophobicity to the inorganic particles.

In one implementation of the method, the fluorinated polymer includes polytetrafluoroethylene (PTFE).

In one implementation of the method, producing the filler particles includes: introducing the surface-treated inorganic particles and a polymerization initiator into a reactor; and adding tetrafluoroethylene (TFE) monomers to the reactor and carrying out emulsion polymerization thereof.

In one implementation of the method, dispersing the inorganic particles in the solvent includes adding a fluorine-based emulsifier into the solvent and dispersing the inorganic particles in the solvent, wehrein the solvent include water, N,N-dimethylformamide (DMF), N,N-diethylacetamide (DEAc), N,N-dimethylacetamide (DMAc), or N-methyl-2-pyrrolidinone (NMP), etc.

DESCRIPTION OF SPECIFIC EMBODIMENTS

Hereinafter, the embodiments disclosed in the present specification will be described in detail with reference to the accompanying drawings. The same reference numbers may be allocated to the same or similar components are given. Redundant descriptions thereof will be omitted. As used herein, a suffix "module" or "unit" as used for a component are intended only for ease of writing the present disclosure, and the suffix "module" or "unit" itself does not have a specific meaning or role. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure. Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

Further, the features of the various embodiments of the present disclosure may be partially or entirely combined with each other, and may be technically associated with each other or operate with each other. The embodiments may be implemented independently of each other and may be implemented together in an association relationship.

In addition, it will also be understood that when a first element or layer is referred to as being present "on" or "beneath" a second element or layer, the first element may be disposed directly on or beneath the second element or may be disposed indirectly on or beneath the second element with a third element or layer being disposed between the first and second elements or layers. It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Figure 1:
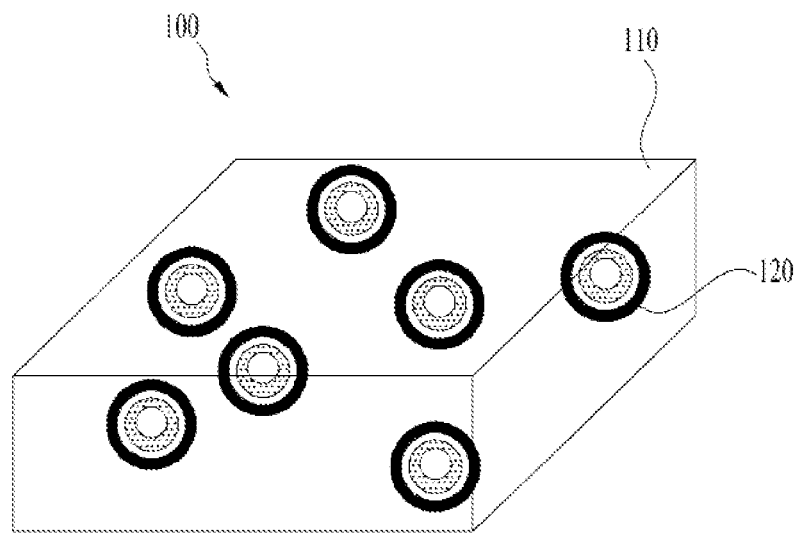
FIG. 1 is a conceptual diagram showing a composite polyimide film according to an embodiment of the present disclosure.

FIG. 1 is a conceptual diagram showing a composite polyimide film according to an embodiment of the present disclosure.

Referring to FIG. 1, a composite polyimide film 100 may be composed of a film matrix 110 including polyimide, and a plurality of filler particles 120 contained in the matrix 10, wherein each of the plurality of filler particles 120 includes an inorganic particle and a fluorine polymer (or fluorinated polymer) coating formed on the particle.

The inorganic particle constituting the filler particle 120 may include a silica particle ($SiO_2$ particle) 122 or 125. According to some embodiments, the silica particles may be hollow silica or mesoporous silica particles.

Figure 2:
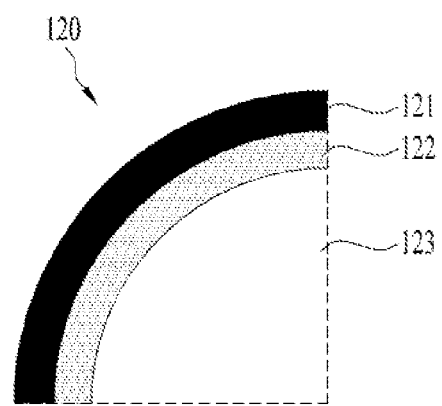
FIG. 2 is a schematic diagram showing an example of a silica particle of a composite polyimide film according to an embodiment of the present disclosure.
Figure 3:
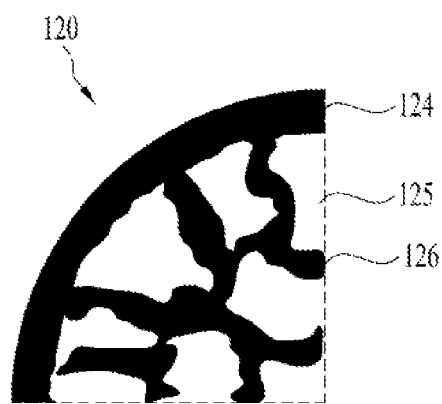
FIG. 3 is a schematic diagram showing another example of a silica particle of a composite polyimide film according to an embodiment of the present disclosure.

FIG. 2 is a schematic diagram showing an example of a silica particle of a composite polyimide film according to an embodiment of the present disclosure. Further, FIG. 3 is a schematic diagram showing another example of a silica particle of a composite polyimide film according to an embodiment of the present disclosure.

First, referring to FIG. 2, an example in which hollow silica 122 is used as the inorganic particle of the filler particle 120 is shown. FIG. 2 schematically shows a portion of a spherical particle. The hollow silica 122 is a silica particle in which a hollow space 123 is located inside a spherical particle. The hollow space 123 is filled with air.

The fluorine polymer coating 121 may be formed on an outer face of the hollow silica 122. This fluorine polymer coating 121 may be coated on an entirety of the outer surface of each of the hollow silica particles 122.

That is, referring to FIG. 2, the hollow silica 122 has the hollow space 123 which is a spherical inner space and is filled with air. A silica ($SiO_2$) shell of a substantially uniform thickness may surround the hollow space 123. The fluorine polymer coating 121 may be positioned on an outer face of the silica shell and may have a substantially uniform thickness.

Next, referring to FIG. 3, an example in which the mesoporous silica 125 is used as the inorganic particle of the filler particle 120 is shown. As in FIG. 2, FIG. 3 schematically shows a portion of a spherical particle. The mesoporous silica 125 refers to a spherical silica particle having pores 126 received therein connected to each other.

The pore 126 of the mesoporous silica 125 in a natural state may be filled with air. However, according to an embodiment of the present disclosure, a fluorine polymer connected to the fluorine polymer coating 124 may be located in the pores 126 of the mesoporous silica 125 used as the filler particle 120 according to the present disclosure.

That is, the fluorine polymer may be filled into at least some of the pores 126 of the mesoporous silica 125 during formation of the fluorine polymer coating 124. FIG. 3 shows a state in which the fluorine polymer is filled into all of the pores 126 of mesoporous silica 125.

According to some embodiments, each of the fluorine polymer and the fluorine polymer coating 121 or 124 may include polytetrafluoroethylene (PTFE).

According to some embodiments, the filler particles 120 may be dispersed and distributed in the film matrix 110.

The fluorine polymer coating 121 may be intended for lowering at least one of a dielectric constant and hygroscopicity of the composite polyimide film 100.

According to some embodiments, the filler particles 120 may be contained in a content of 10 to 40 weight percentage (wt. %) based on a total weight of the film 100.

When the content of the filler particles 120 is lower than 10 weight percentage (wt. %), the effect of the filler particles 120 to lower the dielectric constant may be insignificant.

Further, when the content of the filler particles 120 is greater than 40 weight percentage (wt. %), there is a possibility that the mechanical properties of the film 100 are rapidly deteriorated.

When the silica particles 122 are used as inorganic particles, a volume percentage of air contained in the composite polyimide film 100 while being received in the silica particles 122 may be in a range of 4.8 to 20.6% based on a total volume of the film 100.

For example, a case where the volume percentage of air contained in the composite polyimide film 100 is 4.8% based on a total volume of the film 100 may correspond to a case where the filler particles 120 are contained in 10 weight percentage (wt. %) based on a total weight of the film 100.

Further, a case where the volume percentage of air contained in the composite polyimide film 100 is 20.6% based on the total volume of the film 100 may correspond to a case where the filler particles 120 are contained in 40 weight percentage (wt. %) based on the total weight of the film 100.

According to some embodiments, the filler particles 120 may be contained in a volume percentage of 8 to 35% based on the total volume of the film 100.

Similarly, a case in which the volume percentage of the filler particles 120 is 8% relative to the total volume of the film 100 may correspond to a case in which the filler particles 120 are contained in 10 weight percentage (wt. %) relative to the total weight of the film 100.

Further, a case when the volume percentage of the filler particles 120 is 35% based on the total volume of the film 100 may correspond to a case in which the filler particles 120 are contained in 40 weight percentage (wt. %) relative to the total weight of the film 100.

According to some embodiments, a size of each of the filler particles 120 may be in a range of 100 to 1000 nm. In this connection, the size of each of the filler particles 120 may mean a diameter of each of the filler particles 120.

When the size of each of the filler particles 120 is smaller than 100 nm, it may be difficult to uniformly disperse the particles in the film matrix 110 because the particle aggregation phenomenon increases after coating of the fluorine polymer thereon.

Further, when the size of each of the filler particles 120 is larger than 1000 nm, there may be a possibility that a surface state of the thin film may be deteriorated when the composite polyimide film 100 has a thickness (e.g., in a range of 25 μm or 50 μm) of a polyimide film for a printed circuit board which is generally common.

According to some embodiments, a thickness of the fluorine polymer coating 121 or 124 may be in a range of 10 to 60 nm.

For example, the thickness of the fluorine polymer coating 121 or 124 may vary depending on contents of surfactant, initiator, and fluorine monomer used in the production of the composite polyimide film 100.

In this connection, when the thickness of the fluorine polymer coating 121 or 124 is smaller than 10 nm, the effect of reducing the moisture-absorbing ability of silica may be significantly reduced.

Further, when the thickness of the fluorine polymer coating 121 or 124 is greater than 60 nm, an amount of homopolymer produced via polymerization between only fluorine and fluorine due to excessive polymerization may increase. In addition, aggregation of the filler particles 120 may increase.

According to some embodiments, the content of the fluorine polymer coating 121 or 124 may be in a range of 10 to 30 weight percentage (wt. %) based on a total weight of the filler particles 120.

With the development of communication technology, the speed of Internet access is getting faster. Now is the time of transition from 4G to 5G. An era of new high-speed communication using the gigahertz (GHz) band is opening in the future. According to the 5G standard, a millimeter wavelength (mm wavelength) is employed which may correspond to a frequency of approximately 24 to 100 GHz.

Until now, polyimide as a heat-resistant polymer material has been used as a material for FPCB. This is because polyimide has excellent dimensional stability with a copper foil used for circuit formation and has reverse heat resistance during component mounting.

However, polyimide had drawbacks in that a magnitude of polarization due to charge transfer and an absorption are large. Due to this defect, dielectric constant or dielectric loss increases, resulting in a large transmission loss.

These problems are becoming more prominent in the era (since 5G) of using high-speed communication in the GHz band. Further, as materials suitable for the high-speed communication in the GHz band have begun to be developed, demand for removal of these shortcomings of polyimide is increasing.

When the 5G communication starts, a transmission/reception speed is rapidly increased. However, a signal has strong linearity and loss increases. In order to overcome this situation, currently, sub6 and 5G smartphones use LCP as a type of liquid crystal or polyimide (PI) as an interlayer insulator with low signal loss.

A price of LCP is high. The LCP has a high possibility defects due to poor processability and poor adhesion to the copper foil during substrate formation.

Further, the polyimide (PI) may not be applied to 5G smartphones using the mmWave frequency band in the future due to an increase in dielectric loss due to its high hygroscopicity.

Therefore, according to some embodiments of the present disclosure, the composite polyimide film 100 that is incorporated into an interlayer insulator and thus reduces signal loss in a high frequency 5G area may be provided, wherein the composite polyimide film 100 include the matrix 110 made of the polyimide and low dielectric polymer-inorganic particle composite filler particles 120 as dispersed in the matrix 110.

The filler particles 120 may be dispersed into the polyimide which is widely used as an interlayer insulator of a substrate for communication. Thus, the filler particles 120 may improve the dielectric properties to minimize transmission loss when being applied to 5G smartphone substrates and IF cables. Further, it may be expected that the film 100 will be applied to automobiles, architecture, and IOT products in which 5G communication will be used in the future.

According to some embodiments of the present disclosure, the fluorine polymer is chemically bonded to the surfaces of the inorganic particles via a polymerization process of a fluorine-based monomer, thereby producing the organic/inorganic composite filler particles 120 which are thermally stable even at high temperatures, and has reduced dielectric constant and hygroscopicity.

Further, the filler particles 120 may be dispersed in the polyimide film matrix such that the composite polyimide film 100 having the above defined properties may be produced.

Figure 4:
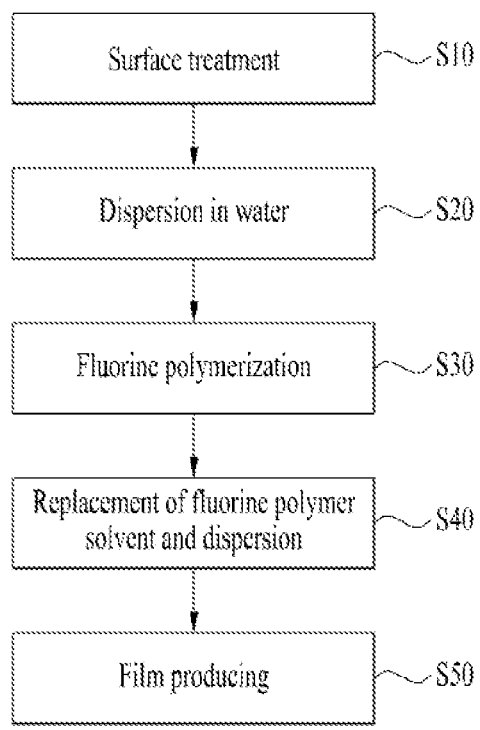
FIG. 4 is a flowchart showing a production process of a composite polyimide film according to an embodiment of the present disclosure.
Figure 5:
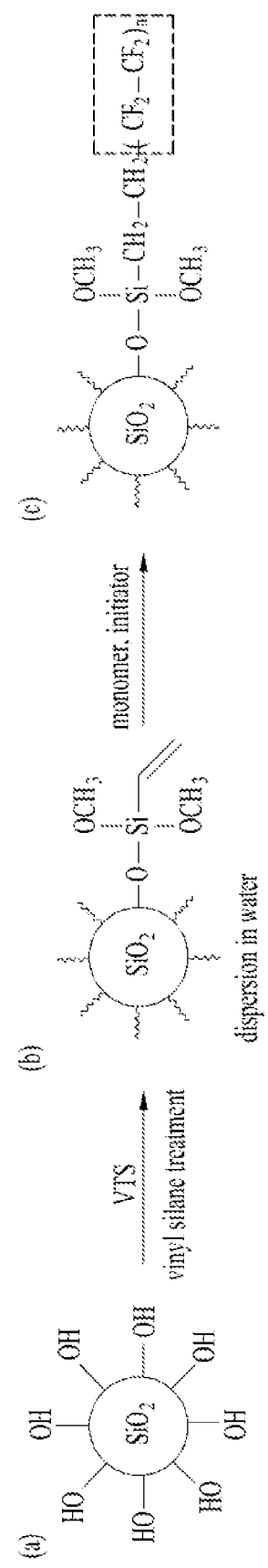
FIG. 5 is a schematic diagram showing a production process of a composite polyimide film according to an embodiment of the present disclosure.

FIG. 4 is a flowchart showing a production process of the composite polyimide film according to an embodiment of the present disclosure. Further, FIG. 5 is a schematic diagram showing a process of producing a composite polyimide film according to an embodiment of the present disclosure.

Hereinafter, with reference to FIG. 4 and FIG. 5, the production process of the composite polyimide film according to an embodiment of the present disclosure will be described in detail.

According to this producing process, the filler particles 120 are produced by chemically bonding fluorine polymer to the surface of the inorganic particles (e.g., silica particles) via the polymerization process of fluorine-based monomers, and the filler particles 120 are mixed with a polyamic acid solution to produce a composite polyimide thin film.

Hereinafter, an example in which the inorganic particles are silica particles will be described. That is, in the following descriptions, inorganic particles may mean silica particles. It may be appreciated, however, that the present disclosure is not limited thereto.

In general, the hollow silica or porous inorganic particles have hydrophilicity. Thus, when the hollow silica or porous inorganic particles are used as a low dielectric filler, hygroscopicity may be increased. According to this embodiment of the present disclosure, in order to suppress this disadvantage, a fluorine polymer coating may be formed on the surface of hollow silica or porous inorganic particles.

In the process of mixing the inorganic particles on which the fluorine polymer coating is formed with a polyamic acid solution to produce a polyimide film, a heat treatment process (an imidization process) at a high temperature of up to 400° C. may be required. In this connection, the fluorine polymer coating may bind to the surface of inorganic particles based on high thermal stability and thus may maintain the low dielectric constant and low hygroscopicity as described above.

With reference to FIG. 4 and FIG. 5, the detailed producing process of the composite polyimide film according to an embodiment of the present disclosure is described as follows.

First, step S10 of treating the surface of inorganic particles to be used as the filler particles 120 may be performed. The silica particles 121 or 124 may be used as examples of these inorganic particles.

Referring to (a) in FIG. 5, a hydroxy group may be added to the silica particle ($SiO_2$) before the surface treatment.

A major feature of the hydroxy group is that the groups are capable of hydrogen bonding to each other. Due to the hydrogen bond, the silica particle may have affinity with water.

According to some embodiments, step S10 of surface-treating the inorganic particles may include a step of treating the surface of the inorganic particles with reactive silane.

According to some embodiments, step S10 of surface-treating the inorganic particles may impart hydrophobicity to the inorganic particles.

In a more specific example, in step S10 of surface treatment of inorganic particles, the surface of silica or inorganic particles having pores may be treated with reactive silane having a vinyl group or a methacrylate group (vinyl and methacrylate silane treatment).

That is, the silica or inorganic particles having pores are added to an organic solvent such as methanol, tetrahydrofuran, ethanol, and dichloromethane, and then, vinyl silane (vinyl triethoxysilane, 3-(trimethoxysilyl propyl methacrylate, etc.) is added thereto to perform silane treatment on the surface thereof.

Thus, compatibility between silica particles and TFE monomer may be secured during emulsion polymerization of the fluorine polymer (e.g., PTFE), and further, an anchoring site may be built on the surface of the silica particles.

That is, according to some embodiments, the fluorine polymer may be polytetrafluoroethylene (PTFE).

Next, the surface-treated inorganic particles may be dispersed in a solvent in S20. In this connection, the solvent may be water. That is, the process of dispersing the surface-treated inorganic particles in the solvent may be an aqueous dispersion process ((b) in FIG. 5).

In step S20 of dispersing these inorganic particles in the solvent, a fluorine-based emulsifier may be added thereto to disperse the inorganic particles in water.

In a specific example, the vinyl silane treated silica particles (e.g., hollow silica particles) may be added to a small amount of fluorine-based emulsifier used for emulsion polymerization of PTFE and may be dispersed in water.

That is, the hollow silica and a fluorine-based emulsifier may be added to deionized water, and the silica particles may be dispersed in water using a sonicator.

In this connection, the fluorine-based emulsifier may include PFOA (perfluorooctanoic acid), perfluoro-3,6,9-trioxadecanoic acid, perfluoro(2,5-dimethyl-3,6-dioxanonanoic acid), and the like.

Thereafter, the filler particles 120 may be formed by polymerizing the fluorinated polymer coating on the inorganic particles in S30.

According to some embodiments, step S30 of forming the filler particles 120 may include a step of inputting the surface-treated inorganic particles and a polymerization initiator into a reactor and a step of inputting a tetrafluoroethylene (TFE) monomer thereto to perform the emulsion polymerization.

The vinylsilane-treated inorganic particles and a polymerization initiator (ammonium persulfate; APS) may be put into a high-pressure reactor and a temperature of the reactor may be raised up to a preset temperature, for example, 80° C. Then, a degassing process may be performed and then the tetrafluoroethylene (TFE) monomer may be added thereto to perform the emulsion polymerization ((c) in FIG. 5).

The silica particles having the fluorinated polymer coating formed thereon may be phase-separated from the result product of the emulsion polymerization by themselves and thus may be recovered.

In this manner, the inorganic particles having the fluorine polymer coating formed thereon may be produced.

Next, a composite polyimide film may be produced using the filler particles 120 including the inorganic particles having the fluorine polymer coating formed thereon as produced via the emulsion polymerization as described above in S40 and S50.

To this end, first, the filler particles 120 may be dispersed in the polyamic acid solvent in S40.

The silica or inorganic particles having the fluorine polymer coating formed thereon may be separated from the result product of the emulsion polymerization, and then may be mixed with the polyamic acid solution.

In particular, it is identified that the inorganic particles having the fluorine polymer (PTFE) coating formed thereon may be directly dispersed into a solvent that dissolves the polyamic acid, such as N,N-dimethylformamide (DMF), N,N-diethylacetamide (DEAc), N,N-dimethylacetamide (DMAc) and N-methyl-2-pyrrolidone (NMP) without additional input of the dispersant thereto.

Then, the polyamic acid solution may be produced into a film in S50.

That is, the inorganic particles-polyamic acid mixture may be coated. Then, the imidization process may be performed to produce the composite polyimide film including the filler particles 120 including the inorganic particles and the fluorine polymer coating formed thereon.

Hereinafter, specific examples will be described in detail based on each step.

EXAMPLE 1

Producing of Surface-Treated Hollow Silica (For example, 30 g of) mesoporous silica or hollow silica having pores was input to a container (flask), and (for example, 500 mL of) ethanol was used as a reaction solvent. In order to obtain a uniform dispersed phase, stirring occurred for 1 hour, and ultrasonication occurred for 20 minutes.

Then, an aqueous ammonia solution and VTS (vinyl triethoxysilane) were added thereto, and stirring was carried out for 24 hours at room temperature and under nitrogen condition.

The treated silica was precipitated using a centrifuge, and then redispersion via sonication in ethanol and re-precipitation using a centrifuge were performed three times, and then drying was performed in a vacuum oven for 24 hours to obtain the surface-treated hollow silica.

EXAMPLE 2

Producing of Solution in which Surface-Treated Hollow Silica Particles are Dispersed in Water Before Emulsion Polymerization Distilled water and PFOA (perfluorooctanoic acid) as a fluorine-based emulsifier were added to a container (beaker), and stirring occurred for 30 minutes.

Then, the surface-treated silica or hollow silica particles having the pores as obtained in <Example 1> were added thereto. The surface-treated silica or hollow silica particles were dispersed until there were no particles that were precipitated and settled, via the sonication process and the dispersion process using a homogenizer. Thus, the solution in which the surface-treated hollow silica particles are dispersed in water was produced.

EXAMPLE 3

Producing of Hollow Silica Particles Having Fluorinated Polymer Coating Formed Thereon The silica or hollow silica particles dispersed solution as produced in <Example 2> and ammonium persulfate as an initiator were put into a high-pressure reactor, and then stirring occurred at 200 rpm.

In order to remove residual oxygen, a $N_2$ bubbling process was performed for 20 minutes to replace an inside of the reactor with nitrogen atmosphere. A reduced pressure was generated using a vacuum pump.

Further, for additional degassing, a process of replacing the reactor with $N_2$, and TFE (tetrafluoroethylene) gas and generating the reduced pressure was performed.

The reactor temperature was raised up to 80° C. and a stirring speed was raised up to 500 rpm, and then the TFE gas was charged into the reactor to start the reaction.

Then, the polymerization proceeded until the reactor pressure drops to 2.66 bar. The TFE gas was evacuated. Thus, the reaction was terminated.

The polymer-precipitated solution was cooled to room temperature, filtered, and dried at 70° C. for 12 hours and 150° C. for 12 hours to obtain the silica or hollow silica particles having the pores and coated with the fluorine polymer.

EXAMPLE 4

Producing of Polyimide Thin Film in which PTFE-Hollow Silica Particles having Pores are Dispersed The PTFE-hollow silica particles as produced in <Example 3> and DEAc were put into a 25 mL vial and were dispersed therein for 10 minutes using an ultrasonic disperser.

Then, PAA vanish was added thereto. Further dispersion was carried out for 10 minutes using an ultrasonic disperser.

A PAA vanish solution in which the PTFE-hollow silica particles are uniformly dispersed is spin-coated on a top face of the substrate. A temperature was raised using a hot plate in a box substituted with $N_2$ to perform the imidization process.

Thus, a polyimide film was formed. Thereafter, the polyimide film was immersed in water for 3 hours or greater, peeled from the substrate, and dried in a vacuum oven for 6 hours to remove residual moisture.

According to the producing method of the present disclosure, the fluorinated polymer coating may be formed on the surface of the silica or inorganic particles having pores.

That is, the fluorinated polymer coating may be formed on the surfaces of hydrophilic silica or inorganic particles via the polymerization of the fluorinated polymer.

The fluorinated polymer coating imparts hydrophobicity to the hydrophilic inorganic particles to lower the hygroscopicity. The low dielectric properties inherent in the fluorinated polymer are applied, so that the inorganic particles on which the coating is formed may also have a low dielectric constant.

The inorganic particles having the fluorine polymer coating formed thereon may be directly dispersed into the solvent that dissolves the polyamic acid, such as N,N-dimethylformamide (DMF), N,N-diethylacetamide (DEAc), N,N-dimethylacetamide (DMAc) and N-methyl-2-pyrrolidone (NMP), without additional input of the dispersant thereto.

The fluorinated polymer coating formed on the surface of the inorganic particles has high thermal stability. Thus, when producing a composite film between the particles and the polyimide, the coating may stably maintain a binding state to the particle surface even at a high heat treatment temperature of 400° C. Thus, the loss of the above defined features may be prevented.

Figure 6:
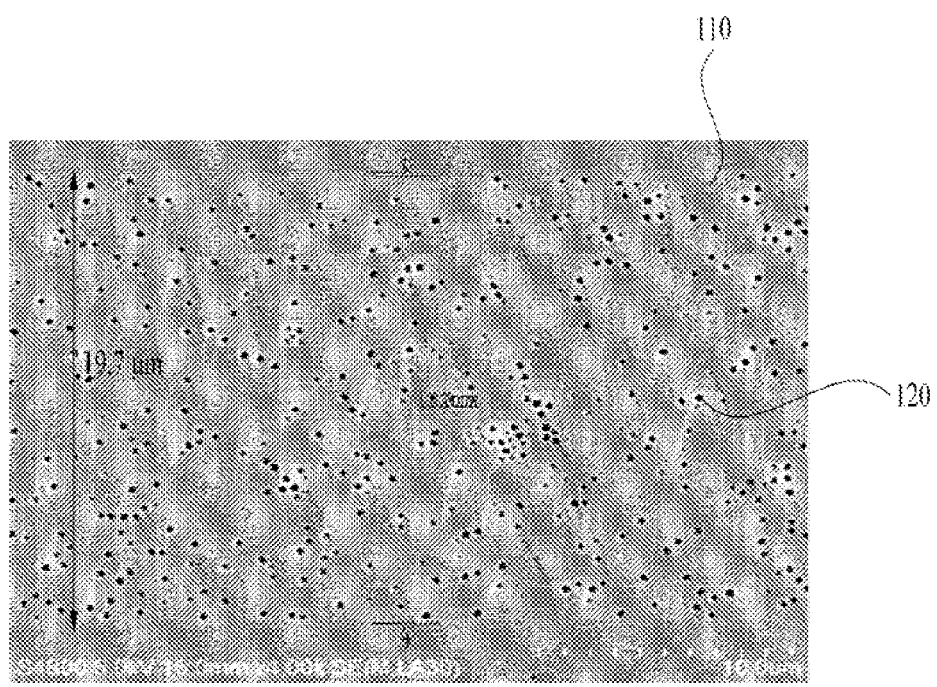
FIG. 6 is a photograph of a composite polyimide film according to an embodiment of the present disclosure.

FIG. 6 is a photograph of a composite polyimide film according to an embodiment of the present disclosure.

Referring to FIG. 6, a SEM (Scanning Electron Microscopy) image of a composite polyimide film produced using the filler particles 120 including the inorganic particles hollow silica particles on which the fluorine polymer coating is formed is shown.

FIG. 6 shows the SEM image of the composite polyimide film in which the filler particles 120 are contained in 10 weight percentage (wt. %) in the film matrix 110 in based on a total weight of the film.

As shown, it may be identified that the filler particles 120 are evenly dispersed in the entire area of the film matrix 110.

Figure 7:
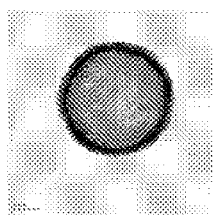
FIG. 7 is a photograph of each of filler particles of a composite polyimide film according to an embodiment of the present disclosure.
Figure 7:
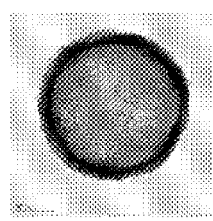
Figure 7:
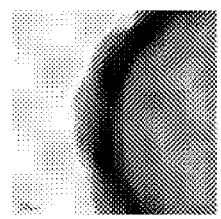

FIG. 7 is a photograph of each of filler particles of a composite polyimide film according to an embodiment of the present disclosure.

(A) in FIG. 7 shows a photograph of hollow silica before the fluorine polymer coating is formed, and (B) and (C) in FIG. 7 show the photographs of hollow silica after the fluorine polymer coating is formed.

When comparing (B) in FIG. 7 and (C) in FIG. 7 C with (A) in FIG. 7, it may be identified that the fluorine polymer coating has been formed in (B) in FIG. 7 and (C) in FIG. 7 C.

Figure 8:
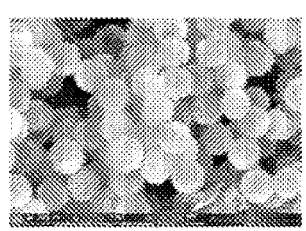
FIGS. 8 and 9 are photographs showing an example of filler particles of a composite polyimide film according to an embodiment of the present disclosure.
Figure 8:
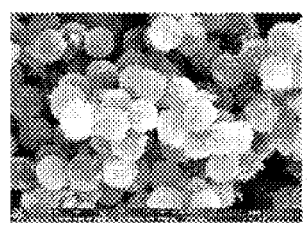
Figure 8:
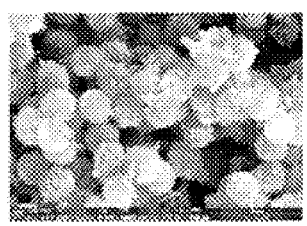
Figure 8:
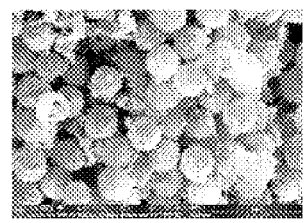
Figure 8:
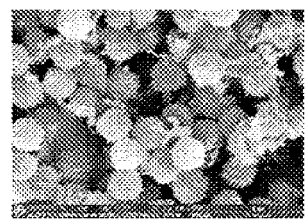
Figure 9:
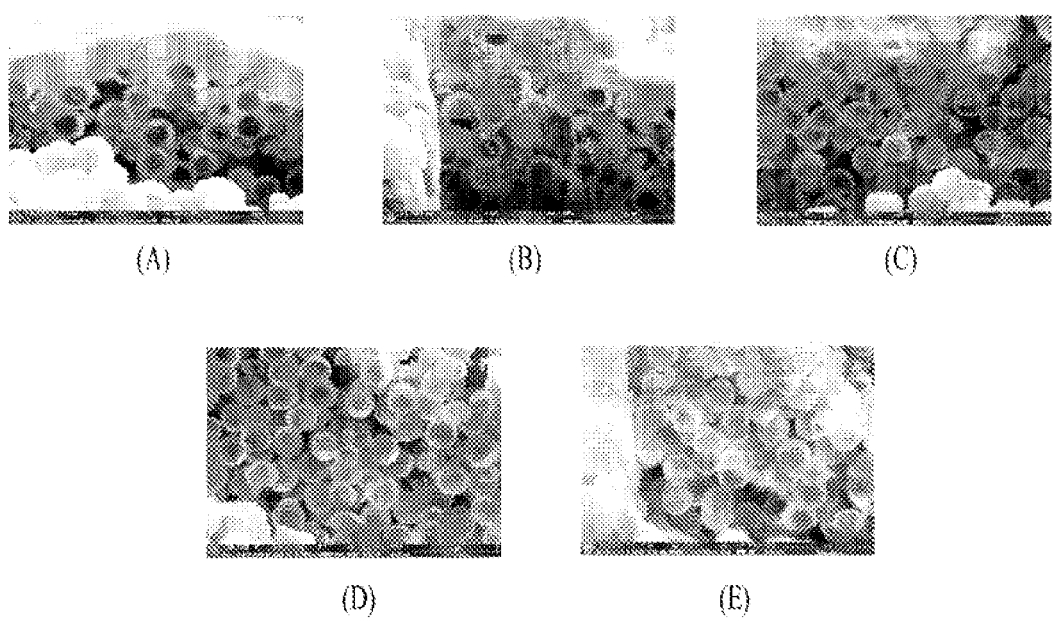

FIGS. 8 and 9 are photographs showing examples of filler particles of a composite polyimide film according to an embodiment of the present disclosure. FIG. 8 and FIG. 9 are photographs to identify the characteristics of a modified emulsifier. FIG. 8 shows a surface image, and FIG. 9 shows a cross-sectional image.

(A) in FIG. 8 and (A) in FIG. 9 show photos of hollow silica before the fluorine polymer coating is formed. Further, (B) in FIG. 8 to (E) in FIG. 8 and (B) in FIG. 9 to (E) in FIG. 9 show photos of the filler particles according to change in the emulsifier content, respectively.

(B) in FIG. 8 and (B) in FIG. 9 show a state in which 0.2 weight percentage (wt. %) of the emulsifier is used and thus the fluorine polymer coating is formed to have a thickness of 53.0±13.3 nm.

(C) in FIG. 8 and (C) in FIG. 9 show a state in which 0.2 weight percentage (wt. %) of the emulsifier is used and thus the fluorine polymer coating is formed to have a thickness of 40.5±0.5 nm.

(D) in FIG. 8 and (D) in FIG. 9 show a state in which 0.4 weight percentage (wt. %) of the emulsifier is used and thus the fluorine polymer coating is formed to have a thickness of 47.6±2.2 nm.

(E) in FIG. 8 and (E) in FIG. 9 show a state in which 0.2 weight percentage (wt. %) of a different type of emulsifier is used and thus the fluorine polymer coating is formed to have a thickness of 45.8±2.1 nm.

In this way, it may be identified that the fluorine polymer (PTFE)-coated hollow silica particles may be synthesized using the modified emulsifier (FIB-SEM image).

It is identified based on a result of FIB shape analysis of the hollow silica particle coated with fluorine polymer (PTFE) as synthesized using the modified emulsifier that a diameter of the hollow silica particle is increased by about 5% and a thickness of the coating is increased by about 37.7%, compared to those in (A) in FIG. 8 and (A) in FIG. 9 which are hollow silica particles (reference samples) before the fluorine polymer coating is formed.

In this connection, the modified emulsifier may refer to an emulsifier which may be dispersed in a solvent that dissolves the polyamic acid without additional dispersant input while dispersing the inorganic particles or filler particles 120.

Figure 10:
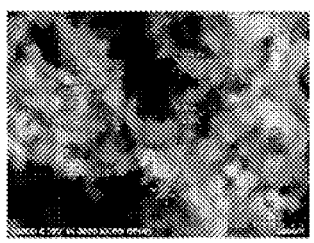
FIG. 10 is a photograph showing another example of filler particles of a composite polyimide film according to an embodiment of the present disclosure.
Figure 10:
Figure 10:
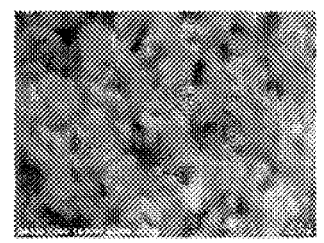

FIG. 10 is a photograph showing another example of filler particles of a composite polyimide film according to an embodiment of the present disclosure. FIG. 10 shows a photograph of the filler particles formed when mesoporous silica particles are used as the inorganic particles.

(A) in FIG. 10 shows a photograph of mesoporous silica before the fluorine polymer coating is formed. Further, (B)

and (C) in FIG. 10 show the state of the filler particles according to the change in the dispersant content, respectively.

(A) in FIG. 10 shows that the mesoporous silica particle has a particle size of 17.4±2.6 nm before the fluorine polymer coating is formed.

(B) in FIG. 10 is a photograph of filler particles when 0.2 weight percentage (wt. %) of the dispersant is used, and the filler particle has a particle size of 18.3±0.5 nm.

Further, (C) in FIG. 10 is a photograph of filler particles when 0.4 weight percentage (wt. %) of the dispersant is used, and the particle has a particle size of 21.3±2.5 nm.

These results show the results of particle size and EDS composition analysis to identify the presence or absence of the PTFE coating after the synthesis of the mesoporous silica particles coated with the fluorine polymer (PTFE).

It may be identified based on a result of SEM/EDS analysis to identify the presence or absence of the PTFE coating that the particle sizes of the sample in (A) in FIG. 10 and the sample in (B) in FIG. 10 are similar to each other, and the particle size of the sample in (C) in FIG. 10 increases by about 22.4% compared to that in the sample in (A) in FIG. 10.

Figure 11:
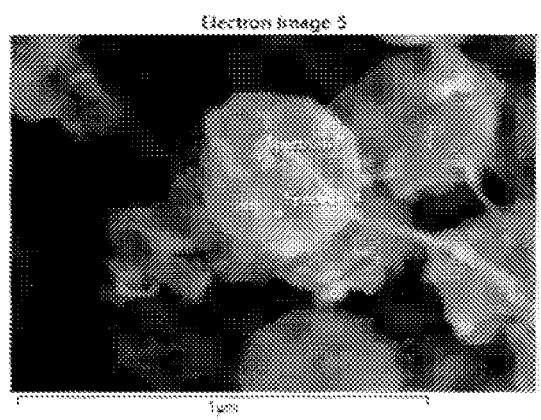
FIG. 11 is a photograph showing element mapping of filler particles of a composite polyimide film according to an embodiment of the present disclosure.

FIG. 11 is a photograph showing element mapping of filler particles of a composite polyimide film according to an embodiment of the present disclosure.

Further, Table 1 below shows a EDS element mapping result.

TABLE 1

| Spectrum Label | Spectrum 3 | Spectrum 4 |
| --- | --- | --- |
| C | 43.30 | 31.25 |
| O | 23.39 | 26.77 |
| F | 5.10 | 4.30 |
| Si | 28.21 | 37.67 |
| Total | 100.00 | 100.00 |

Thus, it may be identified based on a result of the EDS composition analysis that carbon (C), oxygen (O), silicon (Si), and fluorine (F) are detected. Accordingly, it may be identified that the fluorine polymer coating is formed on the filler particles.

Figure 12:
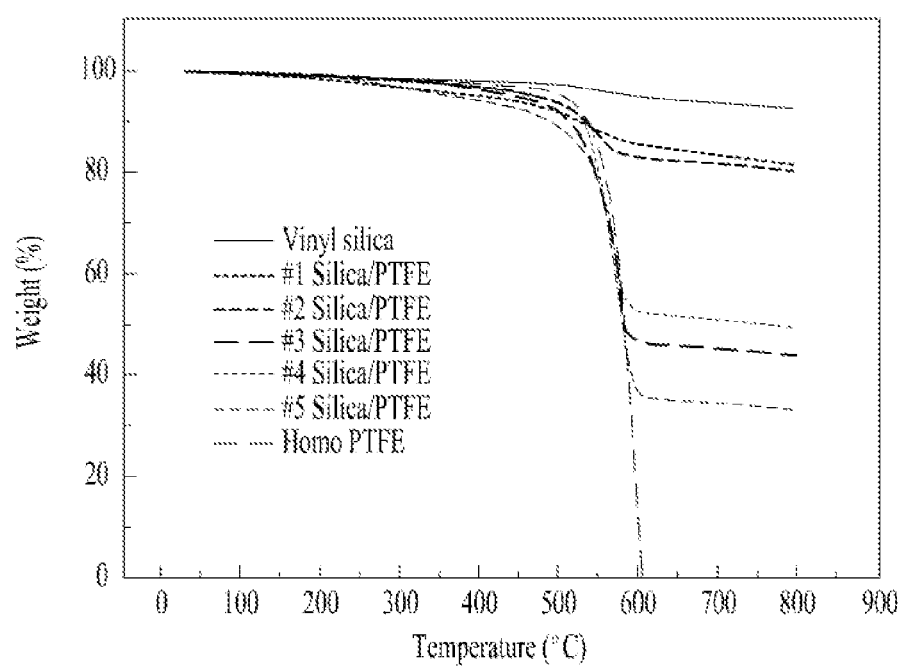
FIG. 12 is a graph showing an example of a thermogravimetric analysis result of inorganic particles of a composite polyimide film according to an embodiment of the present disclosure.

FIG. 12 is a graph showing an example of a thermogravimetric analysis result of inorganic particles of a composite polyimide film according to an embodiment of the present disclosure.

This thermogravimetric analysis TGA shows a result of a process to determine a mass of PTFE in the filler particles including the hollow silica particles.

TGA was measured after drying in a vacuum oven at 150° C. for 6 hours.

It may be identified based on a result of analysis of #3 and #4 silica-PTFE samples that the mass reduction by about 40% is observed at a temperature near the PTFE thermal decomposition temperature of 500 to 600° C.

Thus, it may be identified that the pure PTFE is contained in a 40% amount relative to a weight of the silica particles. Thus, the fluorine polymer may be contained in 20 to 80% based on the weight of the silica particles.

Figure 13:
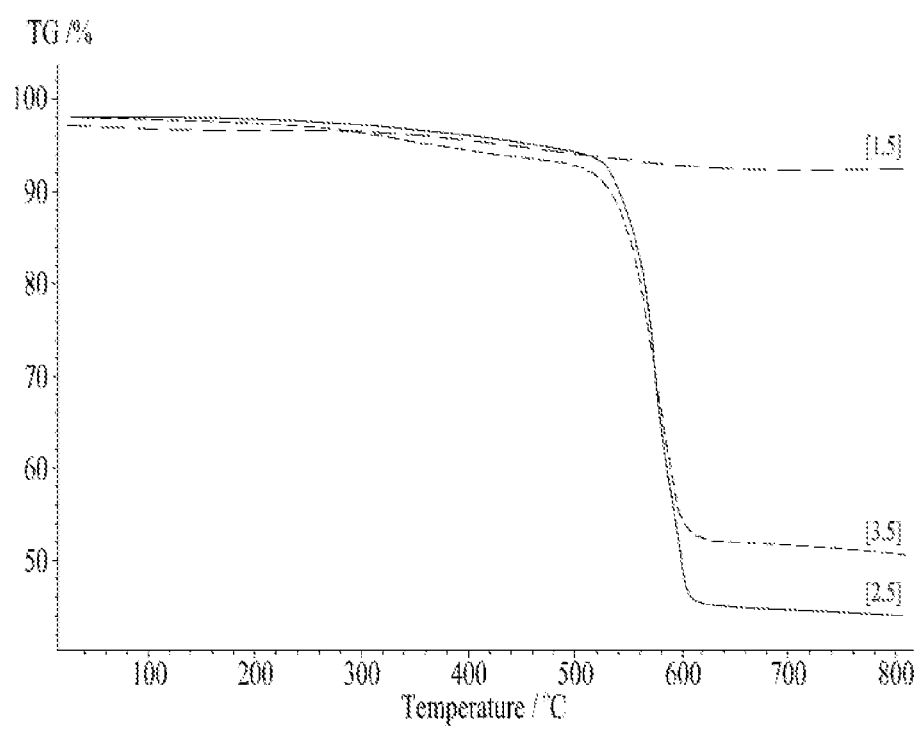
FIG. 13 is a graph showing another example of a thermogravimetric analysis result of inorganic particles of a composite polyimide film according to an embodiment of the present disclosure.

FIG. 13 is a graph showing another example of a thermogravimetric analysis result of inorganic particles of a composite polyimide film according to an embodiment of the present disclosure.

This thermogravimetric analysis TGA shows a result of a process to determine the mass of PTFE in the filler particles including mesoporous silica particles.

It may be identified based on this analysis result that the PTFE coating has a content of about 41.3 to 47.9 weight percentage (wt. %) based on a weight of the mesoporous hollow space silica.

Figure 14:
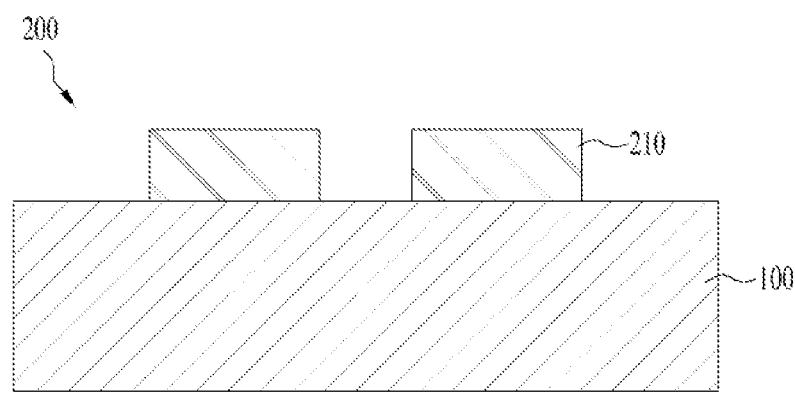
FIG. 14 is a cross-sectional schematic diagram showing an example of a printed circuit board to which a composite polyimide film according to an embodiment of the present disclosure is applied.

FIG. 14 is a cross-sectional schematic diagram showing an example of a printed circuit board to which a composite polyimide film according to an embodiment of the present disclosure is applied.

Referring to FIG. 14, a printed circuit board 200 includes the composite polyimide film 100 and a circuit pattern 210 on the composite polyimide film 100.

As described above, the composite polyimide film 100 may be composed of the film matrix 110 including polyimide, and the plurality of filler particles 120 dispersed in the film matrix 110, wherein the filler particle includes an inorganic particle, and a fluorine polymer coating formed on the inorganic particle.

The printed circuit board 200 including the composite polyimide film 100 and the circuit pattern 210 on the composite polyimide film 100 may maintain the dimensional stability of the polyimide, and may achieve low dielectric constant, and low dielectric loss. In addition, the composite polyimide film 100 having the characteristics as described above may obtain a low coefficient of linear expansion and high adhesive strength to the copper foil.

In addition, contents that are not described may refer to those as described above with reference to FIGS. 1 to 11.

Figure 15:
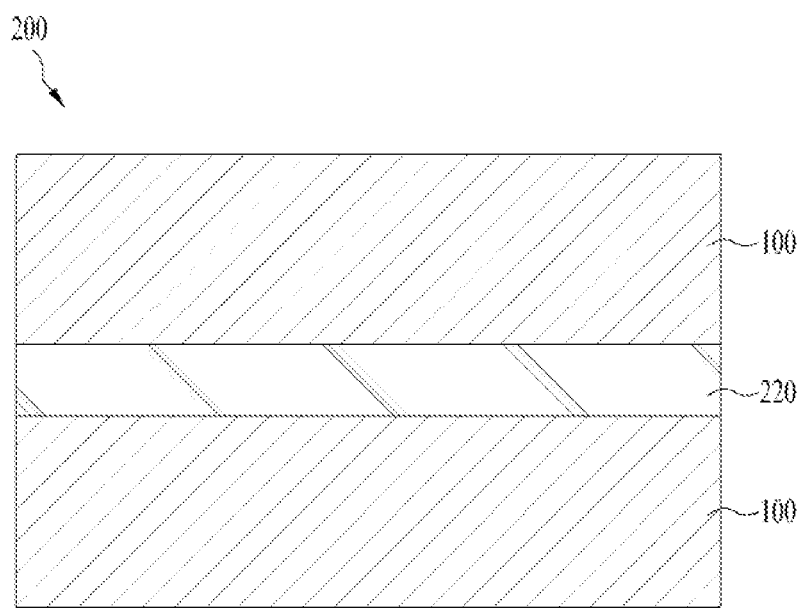
FIG. 15 is a cross-sectional schematic view showing another example of a printed circuit board to which a composite polyimide film according to an embodiment of the present disclosure is applied.

FIG. 15 is a cross-sectional schematic view showing another example of a printed circuit board to which a composite polyimide film according to an embodiment of the present disclosure is applied.

Referring to FIG. 15, in a printed circuit board 200, the circuit pattern 220 is formed between two composite polyimide films 100.

As described above, the composite polyimide film 100 may be composed of the film matrix 110 including polyimide, and the plurality of filler particles 120 dispersed in the film matrix 110, wherein the filler particle includes an inorganic particle, and a fluorine polymer coating formed on the inorganic particle.

In addition, contents that are not described may refer to those as described above with reference to FIGS. 1 to 11.

Therefore, according to some embodiments of the present disclosure, the composite polyimide film 100 that is incorporated into an interlayer insulator and thus reduces signal loss in a high frequency 5G area may be provided, wherein the composite polyimide film 100 include the matrix 110 made of the polyimide and low dielectric polymer-inorganic particle composite filler particles 120 as dispersed in the matrix 110.

The filler particles may be dispersed into the polyimide which is widely used as an interlayer insulator of a substrate for communication. Thus, the filler particles may improve the dielectric properties to minimize transmission loss when being applied to 5G smartphone substrates and IF cables. Further, it may be expected that the film will be applied to automobiles, architecture, and IOT products in which 5G communication will be used in the future.

According to some embodiments of the present disclosure, the fluorine polymer is chemically bonded to the surfaces of the inorganic particles via a polymerization process of a fluorine-based monomer, thereby producing the organic/inorganic composite filler particles 120 which are thermally stable even at high temperatures, and has reduced dielectric constant and hygroscopicity.

Further, the fluorinated polymer coating imparts hydrophobicity to the hydrophilic inorganic particles to lower the hygroscopicity. The low dielectric properties inherent to the fluorinated polymer are applied such that the inorganic particle having the coating formed thereon may have a low dielectric constant.

The above description is merely an exemplary description of the technical idea of the present disclosure. Person having ordinary knowledge in the technical field to which the present disclosure belongs may make various modifications and variations without departing from the essential characteristics of the present disclosure.

Therefore, the embodiments as disclosed in the present disclosure are intended for description of the technical idea of the present disclosure rather than limiting the technical idea of the present disclosure. Thus, the scope of the technical idea of the present disclosure is not limited by the embodiments.

The scope of protection of the present disclosure should be interpreted by the claims below, and all technical ideas within the scope equivalent thereto should be construed as being included in the scope of the present disclosure.

What is claimed is:

1. A composite polyimide film comprising:
   a film matrix including polyimide; and
   a plurality of filler particles dispersed in the film matrix,
   wherein at least one of the plurality of filler particles includes an inorganic particle, and a fluorine polymer coating formed on the inorganic particle,
   wherein the inorganic particle includes a silica ($SiO_2$) particle,
   wherein the silica particle includes a hollow silica particle or a mesoporous silica particle, and
   wherein a thickness of the fluorine polymer coating is in a range of 10 to 60 nm.

2. The composite polyimide film of claim 1, wherein air is contained in the silica particle, wherein a volume percentage of air with respect to a total volume of the film is in a range of 4.8 to 20.6%.

3. The composite polyimide film of claim 1, wherein the fluorine polymer is disposed in at least a portion of a pore of the silica particle.

4. The composite polyimide film of claim 1, wherein the fluorine polymer coating is capable of reducing at least one of a dielectric constant or hygroscopicity of the composite polyimide film.

5. The composite polyimide film of claim 1, wherein the fluorine polymer includes polytetrafluoroethylene (PTFE).

6. The composite polyimide film of claim 1, wherein a weight percentage of the filler particles with respect to a total weight of the film is in a range of 10 to 40%.

7. The composite polyimide film of claim 1, wherein a volume percentage of the filler particles with respect to a total volume of the film is in a range of 8 to 35%.

8. The composite polyimide film of claim 1, wherein a size of the filler particles is in a range of 100 to 1000 nm.

9. The composite polyimide film of claim 1, wherein the filler particles are dispersed and distributed in the film matrix.

10. A printed circuit board comprising:
    a composite polyimide film including:
        a film matrix including polyimide; and
        a plurality of filler particles dispersed in the film matrix,
            wherein at least one the filler particle includes an inorganic particle, and a fluorine polymer coating formed on the inorganic particle; and
    a circuit pattern formed on the composite polyimide film,
    wherein the inorganic particle includes a silica (SiO2) particle,
    wherein the silica particle includes a hollow silica particle or a mesoporous silica particle, and
    wherein a thickness of the fluorine polymer coating is in a range of 10 to 60 nm.

11. A method for producing a composite polyimide film, the method comprising:
    treating surfaces of inorganic particles;
    dispersing the inorganic particles in a solvent;
    polymerizing a fluorinated polymer coating onto the inorganic particles to produce filler particles;
    dispersing the filler particles in a polyamic acid solvent to produce a polyamic acid solution; and
    producing the composite polyimide film using the polyamic acid solution,
    wherein the inorganic particle includes a silica ($SiO_2$) particle,
    wherein the silica particle includes a hollow silica particle or a mesoporous silica particle, and
    wherein a thickness of the fluorine polymer coating is in a range of 10 to 60 nm.

12. The method of claim 11, wherein treating the surfaces of the inorganic particles includes treating the surfaces of the inorganic particles with reactive silane.

13. The method of claim 11, wherein treating the surfaces of the inorganic particles imparts hydrophobicity to the inorganic particles.

14. The method of claim 11, wherein the fluorinated polymer includes polytetrafluoroethylene (PTFE).

15. The method of claim 14, wherein producing the filler particles includes:
    introducing the surface-treated inorganic particles and a polymerization initiator into a reactor; and
    adding tetrafluoroethylene (TFE) monomers to the reactor for emulsion polymerization.

16. The method of claim 11, wherein dispersing the inorganic particles in the solvent includes adding a fluorine-based emulsifier into water, and dispersing the inorganic particles in the water.

17. The method of claim 11, wherein air is contained in the silica particle, and wherein a volume percentage of air with respect to a total volume of the film is in a range of 4.8 to 20.6%.

* * * * *